United States Patent [19]
Reüting

[11] 4,104,591

[45] Aug. 1, 1978

[54] METHOD OF ADJUSTING A PERMANENT MAGNET BY USING A HYPOTHETICAL DEMAGNETIZATION CURVE LOWER THAN THE ACTUAL VALUE

[75] Inventor: Hans-Werner Reüting, Peine, Fed. Rep. of Germany

[73] Assignee: Elmeg Elektro-Mechanik GmbH, Peine, Fed. Rep. of Germany

[21] Appl. No.: 710,455

[22] Filed: Aug. 2, 1976

[30] Foreign Application Priority Data

Aug. 1, 1975 [DE] Fed. Rep. of Germany ....... 2534419

[51] Int. Cl.[2] ........................................ G01R 33/12

[52] U.S. Cl. .................................. 324/205; 361/147

[58] Field of Search .................... 324/34 R, 42, 28 R; 361/143, 146–148

[56] References Cited

U.S. PATENT DOCUMENTS

| | | | |
|---|---|---|---|
| 2,590,228 | 3/1952 | Brown | 324/28 R |
| 2,806,186 | 9/1957 | Brown et al. | 324/28 R |
| 3,235,776 | 2/1966 | Ireland | 324/45 |
| 3,242,386 | 3/1966 | Avery et al. | 361/146 |
| 3,243,696 | 3/1966 | Louell et al. | 324/28 R |
| 3,479,584 | 11/1969 | Casey | 361/148 |
| 3,596,144 | 7/1971 | Cunningham | 361/148 |

*Primary Examiner*—Robert J. Corcoran
*Attorney, Agent, or Firm*—Ralf H. Siegemund

[57] ABSTRACT

An element together with a prospective shunt load is magnetized to become a permanent magnet whereafter the magnet is stepwise demagnetized, actually along the demagnetization curve but due to load along a load line passing through a point inside the demagnetization curve independently from any variations thereof. This point will serve as operating point of the magnet in the system and the load line is characterized by identifying the operating point establishing a minimum induction on the basis of the shunt so that during normal operation of the magnet in a system smaller flux will not be extracted. The demagnetization steps are tracked by interspersed measuring steps to monitor approach of the desired operating point. The system is preferable a relay and magnetization, demagnetization, measurement and termination are carried out in a different, closed loop system.

23 Claims, 4 Drawing Figures

METHOD OF ADJUSTING A PERMANENT MAGNET BY USING A HYPOTHETICAL DEMAGNETIZATION CURVE LOWER THAN THE ACTUAL VALUE

BACKGROUND OF THE INVENTION

The present invention relates to magnetizing an element to serve as a permanent magnet in a magnetic system and circuit.

Permanent magnets are frequently provided as such in that the element to be magnetized is installed in the system in which it is to be used, and thereafter a strong magnetizing field is applied. Following cessation of the application of that field, the system settles to a particular magnetic state in which the now completed permanent magnet experiences particular load conditions. Particularly, the magnet will have a particular magnetic induction at a particular magnetic field establishing an operating and working point. This point in the induction field diagram is determined essentially by two conditions. One condition is established by the magnetic conduction of the entire magnetic system, e.g. the minimum magnetic flux values loading the magnet. The other condition is the quality of the magnetic material expressed quantitatively as the demagnetization curve of the magnet.

In order to arrive at a particular operating point, care must be taken that the magnetic conduction of the magnetic system (including conduction through stray fields) is accurately arrived at through production of exact geometric dimensions and through accurately predetermined magnetic characteristics of the components participating in the system. Moreover, the particular permanent magnetic material must have an accurately determined demagnetization curve. With regard to each individual system this can readily be provided for. However, the situation is different if many similar systems are to be made, e.g. polarized electromagnetic relays, each to have the same effective properties such as response, holding force, etc. Particularly, the demagnetization curve must be expected to differ from magnet to magnet, possibly even to a considerable extent. Thus, otherwise seemingly similar systems, when magnetized under similar conditions, must be expected to settle at different operating points. Deviations in magnetic permeance of one or the other of the circuit components add (possibly) to the deviation resulting from differing demagnetization curves. This means that, for example, such relays do have different response times, different contact forces, different forces of magnetic attraction, etc. Generally speaking, the different magnetic systems may operate quite differently simply because the permanent magnetic bias differ.

Aside from the foregoing, it must also be considered that externally applied electromagnetization introduced in the system may demagnetize partially the permanent magnet therein, so that its operating point is shifted. This can readily occur, for example, in a polarized relay when the energizing current is too strong for any reason. The relay may loose its polarity more or less, or the magnet may even reverse its magnetization. In either case, the relay is no longer usable.

Previously, one has tried to adjust the actual operating point of such a magnetic system by changing the magnetic conduction of one or another of its components. In connection therewith it has been suggested to include weak magnetic shunt paths in parallel to the permanent magnet, and these shunts were then varied as was deemed necessary. Modifications in these shunts do permit compensation of variations in the conduction elsewhere in the system and from system to system. Also, the demagnetization curves could be modified to some extent so that minor errors in the resulting working and operating point could be corrected. However, such adjustment is rather time-consuming and highly individual for each system and its magnet or magnets.

DESCRIPTION OF THE INVENTION

It is an object of the present invention to provide a new and improved method for magnetizing ferromagnetic elements to serve as permanent magnets so that an operating point is directly produced and in a reproducible manner which causes such a magnet to provide a predictable function even though the magnetic properties of the system may differ from system to system, particularly as regards the demagnetization curve of the permanent-magnetized element!

it is another object of the present invention to provide for a new and improved in situ magnetization of a permanent magnet which does not require subsequent modifications for purposes of correcting an incorrectly produced working point.

It is a further object of the present invention to provide a new and improved method for permanently magnetizing an element under conditions which provide for greater safety against subsequent, relatively large, active demagnetization forces so that the magnet retains its operating characteristics during use.

In accordance with the preferred embodiment of the present invention, it is suggested to proceed as follows for the magnetization of an element which is to serve as permanent magnet in a magnetic system. At first, one selects a hypothetical operating and working point on a hypothetical demagnetization curve characterized by the fact that any true demagnetization curve of similar material for such elements is larger in the sense that for any value for the induction B of the hypothetical demagnetization curve the corresponding magnetic field H on any true demagnetization curve is larger and vice versa. This hypothetical demagnetization curve can be regarded (or has been selected) as a limit demagnetization curve corresponding to an envelope for all possibly occurring demagnetization curves of such elements, thus representing a kind of worst case demagnetization curve; or the hypothetical demagnetization curve may have still smaller B/H values as defined, thus representing a hypothetical worse-than-worst case curve. The element is then magnetized, and as actively applied magnetization ceases, the magnet will settle on a particular B/H point under specific magnetic load conditions on the magnet. This B/H point may be located on its true magnetization curve but the value pair is positively different from the B/H pair defining the above-mentioned, hypothetical working point. Subsequently, the element is partially demagnetized so that under a specific load this selected working point is arrived at.

The load conditions used here are preferably such that the magnetic flux extracted from the magnet is lower than any flux extraction during any subsequent operating states and conditions of the magnet in the system. Preferably also, the demagnetization is carried out in steps each step being preceded by a measuring step which is representative of the resulting magnetic condition of the magnet relative to the desired operating point to be arrived at by this process. The respective next demagnetization step is designed to carry the approach further until the desired operating point has been sufficiently approximated.

It can thus be seen that the principle of the invention resides in the selection of a worst case demagnetization curve or worse, but on a hypothetical basis. Following the initial strong magnetization, the magnet settles on an operating point that is not possibly located on that hypothetical curve but is displaced therefrom in a particular but unpredicted manner, but a controlled, subsequent, partial demagnetization can, in fact, lead to a different operating point, on the hypothetical demagnetization curve. The latter operating point must, of course, bear a specific relation to the actual and expected load conditions on the magnet, with particular emphasis on the load conditions under which the magnet is demagnetized.

Since the resulting operating point is per se independent from the actual demangetization curve of the magnetic material, and is located on a hypothetical "lower quality" curve, that operating point will actually be maintained considerably more stabile than would be possible otherwise. Moreover, different permanently magnetized elements will now be forced to work with the same operating point. Stability of subsequent operation is particularly true, if as stated, the magnet is demagnetized under conditions of minimum flux extraction which means that the measurements interspersed in the stepwise demagnetization process should be carried out under such load conditions; the demagnetization as such does not require the same load, though uniformity throughout is preferred. Particularly, it is preferred to magnetize and to partially demagnetize the magnet under conditions in which only a shunt is present having dimensions so that the magnetic permeance of the magnet with parallel shunt is larger than the sum total of remaining, usually variable, permeances in the completed system in which the completed magnet is inserted, and which load or relieve the magnet. If the other conductive elements are not present, the conditions of the demagnetization process are such that during subsequent normal operation of the system smaller magnetic flux values will not be extracted from the permanent magnet. It should be noted that in the following these additional magnetic permeances in the system are usually to be understood as being minimum values whenever safety against demagnetization during operation of the system is referred to while these additional permeances are to be understood as maximum values whenever reference is made to stability of the working point under normal operating conditions. In connection therewith, it should be noted that those magnetic permeances values which are independent from the operating state of the system, can be included in the shunt upon calculating minimum load conditions.

The demagnetization is preferably carried out by a demagnetization field which is externally applied, conceivably through the same electromagnetic system which was used to magnetize the magnet to begin with. However, one could use also here any energization means present in the system. For example, if the magnetic system is a polarized relay (polarization resulting from the particular presence of the permanent magnet), one may use the energizing relay coil for partially demagnetizing the permanent magnet. Alternatively, the demagnetization may result from physical changes, e.g. in the load portion of the magnetic syste, or through temperature changes or through vibrations imparted upon the magnet.

As stated above, the inventive method is preferably carried out in steps whereby demagnetization steps alternate with measuring steps to monitor the approach of the desired working point. In terms of the particular quantity measured, a reference signal is provided that represents the desired B/H point, or an equivalent magnetic state of the magnet in the system, and the difference between measured quantity and reference signal can be used to determine the quantity of the next demagnetization step.

The demagnetization is best carried out by means of an electrically controlled, electromagnetically produced demagnetizing field. The difference between measured and reference quantities can be indicated by proper instrumentation, and the current for the next demagnetization step can be adjusted accordingly. However, the demagnetization can also be carried out in an automated, closed loop operation, wherein the electrically controlled demagnetizing electromagnet is particularly controlled. The electric control has, as an input, the differential between measured and reference signals while the output of the control determines the current flow into the electromagnet providing the demagnetization accordingly. The relationship between measured differential and subsequent demagnetizing step provides preferably for rapid asymptotic approach. This process can preferably be also terminated in a closed loop operation, e.g. by means of threshold detection which monitors whether the desired working point has been sufficient approximated, so that the process can be terminated.

The same electromagnet can be used initially to provide for the initial magnetization of the permanent magnet. By means of appropriate clocking alternation between measurement and demagnetization is provided for until the signal differential drops below a threshold. It should be noted specifically that in the case of demagnetizing by means of a magnetic field, any measurement during demagnetizing should not be carried out or suppressed otherwise. As far as measurement is concerned, one can, for example, measure the particular induction of the permanent magnet as obtained after initial magnetization and following each demagnetization step. Since the desired operating point has specific relation to the magnetic load, particularly the load under which the measurement is made (e.g. minimum system flux extraction) the measured B-value suffices to determine whether and how far the desired B/H has been approached thus far. Another quantity that can serve as measured representation for the B/H operating point is the magnetic field or magnetic potential (magnetic motive force) of the permanent magnet for a particular system load.

Other measurements that can be used are the following. If, for example, the magnetic system includes a movable armature, its attraction force in an abutting position must have a particular value for a particular B/H operating point of the permanent magnet. The latter point is presumed to be the desired one, and the corresponding attraction force can be calculated or experimentally determined in a prototype. Thus, one may measure this holding force following each demagnetization step, and in the case of automation or otherwise the reference signal referred to above may be the value for the holding force of the device at the desired operating point. Since direct measurement of attraction force may by somewhat cumbersome, one may go one step further and determine the particular excitation in the system which (for the desired state of permanent magnetization) compensates the attraction force to zero; assuming that a shunt causes the desired operating point to concur with zero attraction force. The particular flux needed here is, of course, derived from the system as energized, and the corresponding quantity (e.g. current in the exciter coil) determining the actively produced flux and magnetic potential leading to attraction force zero, is measured and compared with a reference signal which represents the corresponding quantity for causing zero attraction, and the differential can be used at the desired operating point in closed loop operating to control particular demagnetization steps. Whether or not the holding force, of course, is zero, must be determined separately.

If one uses such a magnetic shunt, it was found that zero attraction force is present initially for an induction on the actual demagnetization curve following initial magnetization. Subsequent demagnetization will lead directly to the desired operating point if the latter has also validity for zero attraction in the ultimate operate state of the adjusted system. Thus, demagnetization is tracked along a zero attraction force operating characteristics that leads to the desired operating point. In any event, actual and desired flux for producing zero effective attraction force can be determined and the difference again can serve as controlling quantity for the next demagnetization step.

Another aspect is the following. A particular constant working point and B/H value pair is actually only an indirectly relevant parameter for obtaining particular features in the magnetic system of which the permanent magnet is but one component. If the system includes a movable armature, the response thereof to a particular, externally applied energization may be the or a feature of primary importance. Other factors being the same, a particular bias returning from the permanent magnet in combination with a particular external energization, will produce a particular response, and the desired B/H values for the permanent magnet may have been determined on that basis. If one measures this armature response and controls the stepwise demagnetization on that basis arrival at the desired B/H value will occur only if, in fact, the other conditions are the same. If not, the demagnetization may arrive at a different point which, however, is quite desirable as this way one compensates automatically also for these other deviations.

For example, the magnetic system may be an electromagnetic relay in which the armature is also under the influence of a resilient means, e.g. resilient contacts. The permanent magnet serves as particular bias for the armature. Thus, an indirect representation for the actual and desired B/H point is the armature response time for a particular external energization when applied to the system. However, inherent differences in mechanical properties of the relay are included such as the resilient properties of the armature operated contacts and others, and these tolerances are now considered indirectly in the overall result. The final B/H working point of the permanent magnet arrived at after successive demagnetizations, and after actual and desired response times do not differ any longer, may not be the true one on account of differences in mechanical system properties. However, this particular response time may be the main feature of the system so that this approach of an implicit correction and compensation is particularly advantageous, as it obviates the need for other corrections. The situation is quite similar if one uses instead as measured and reference quantities the particular energization needed to set the armature into motion. Differences in spring bias are also included here. In either case, tolerances of the mechanically active components in the system become less critical as far as production is concerned.

As part of the inventive method, one may additionally measure the maximum permissible operative demagnetization that does not shift the finally produced working point. The working point produced by the inventive method is actually sufficiently far from the true demagnetization curve of the magnet so that operational demagnetization and working point shifts can readily be avoided.

If, as stated above, initial magnetization and subsequent controlled demagnetization are combined in a common process system, care must be taken to limit the demagnetization by using, for example, short current pulses.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Proceeding now to the detailed description of the drawings, FIG. 1 shows a magnetic system which, by way of example, is the essential part of a polarized relay. The relay has two U-shaped magetizable yokes 1 and 2, and a permanent magnet 3 is disposed between the two bases or bottoms of the U-s. Magnet 3 provides particular magnetic system bias.

Figure 1:
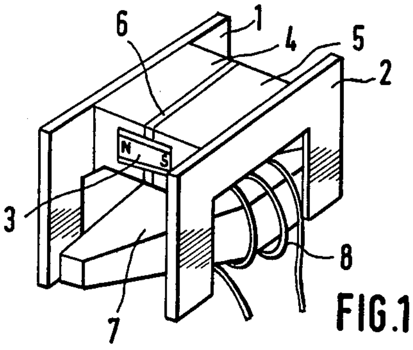
FIG. 1 is a perspective view of a magnetic system having a permanent magnet to be particularly magnetized in accordance with the inventive method.

The magnet 3 is magnetically shunted by means of two magnetically conductive elements 4 and 5 each being bar-shaped but with U-shaped cross-sections, and the permanent magnet 3 is embedded between the legs of the two elements 4 and 5. The ends of the legs of the U-*s* of elements 4 and 5 are spaced by means of a spacer sheet 6 made of a bronze foil. The foil establishes, so to speak, an air gap between element 4 and 5 whose legs provide the magnetic shunt proper for the magent 3, while the portions of elements 4 and 5, abutting the poles of magnet 3, establish a magnetic short circuit connection to the yokes 1 and 2. Since bronze has a permeability which is the same as the permeability of air, sheet 6 establishes a true air gap.

An armature 7 is pivotally mounted between the legs of the yokes 1 and 2 whereby the pivot axis is provided centrally so that the ends of armature 7 abut the diagonally located legs of yokes 1 and 2, one leg per yoke. Armature 7 is surrounded by a coil 8 as schematically indicated, and electric current flowing through the coil energizes the armature. Magnet 3 biases the armature to assume a particular position being maintained when the current through coil 8 re-enforces the bias or when no current flows therethrough.

The relay is, of course, completed by contacts, but they do not participate directly in the inventive method, are conventional and have been omitted. However, it will be recalled that mechanical action on the armature generally, and by resilient contacts in particular, may indirectly be included in considerations for practicing the inventive method in that their composite effect is introduced in a quantity measured as representation of the actual magnetic state of the permanent magnet.

The phenomena occuring upon magnetizing magnet 3 conventionally are explained with reference to FIG. 3. The figure shows magnetic induction (magnetic flux density) B plotted against the effective magnetic field H or magnetomotive force. This field and force is influenced by the magnetic load on the magnet tending to demagnetize it or relieving it on account of bias reinforcing energization. Thus, the curve $E_1$ represents the resulting actual demagnetization curve of and for magnet 3, having validity following magnetization.

It should be observed that such a demagnetization curve does not represent directly the response of magnet 3 to different load conditions. Rather, after the initial magnetization of the element to be turned into a magnet ceases, a particular operating point is established on the demagnetization curve depending on the load on the magnet. This operating point may be the point $B_{01}$; $H_{01}$. Thus initially, a very large magnetic flux is used for magnetizing the magnet 3 leading far to the right of the continuation of curve $E_1$ and establishing saturation in the $B_1-H$ quadrant. Upon turning off this magnetizing field, the flux drops to a value determined by the load on the magnet. This load is established by the combined magnetic impedances of the system as effective on magnet 3, and extracting therefrom a particular flux (e.g. $B_{01}$) under application of a demagnetizing field $H_{01}$, resulting from the magnetization of the impedences by magnet 3. The overall impedence is, for example, determined by the magnet shunt, the permeance of the yokes and of the armature but also by the particular disposition of the armature. A different position thereof, i.e. a different position of the relay, changes the magnetic load on magnet 3. If now magnet 3 has to provide a smaller flux, then the operating point shifts down commensurate with the different induction.

The resulting flux load can be expressed in terms of magnetic permeance which, calculated on the basis of the dimensions of magnet 3, result in so-called shear lines or load impedence or permeance lines, such as *a* and *b*. The line *a* corresponds to the smallest possible magnetic permeance of and in this particular system. The magnetic permeance is to a dominating extent determined by the shunt load 4 and 5, but including also the nonvariable components in the magnetic circuit.

It can thus be seen that the point $B_{01}/H_{01}$ introduced above is defined by a value pair in the B/H diagram in which the acutal demagnetization curve $E_1$ intersects the particular load line *a*. Thus, upon cessation of the initial magnetization and upon maintaining a load condition of minimum magnetic permeance in the circuit of which the magnet 3 is a part, the magnetic state of the magnet will settle on point $B_{01}/H_{01}$. This, in turn, means that, as this point has been reached, an operating point is established which corresponds to the smallest flux and induction that can possibly be extracted at any and all occurring normal operating conditions of the system to which the magnet pertains.

During normal operating, e.g. of the relay only larger inductions (at lower magnetic potentials and demagnetizing magnetic fields as produced by the load) can appear in the magnet 3. The magnetic field strength (magnetic potential) and induction will not vary along demagnetization curve $E_1$, but in first order approximation along a straight line C originating in the point $B_{01}/H_{01}$, and having a slope $\Delta B/\Delta H$ being equal to the magnetic permeability $\mu$ of the material of magnet 3. This line is shown as upwardly sloping line C beginning at $B_{01}/H_{01}$ on curve $E_1$. Line C cannot in reality be continued to the left of demagnetization curve $E_1$ as such a continuation would have no validity in physical reality. Thus, if the magnet 3 would be relieved further from any magnetic load in the sense that a demagnetizing field becomes effective on the magnet larger than $H_{01}$, even temporarily, then the induction would become still smaller than before, and the operating point under such conditions would be shifted down on the demagnetizing curve, e.g. to point $B_{02}$; $H_{02}$. Upon removal of this strong demagnetizing effect, the magnetic state of magnet recovers along a newly established working curve being a straight line $C^1$ originating in $B_{02}$; $H_{02}$ and running up towards the right as plotted. The slope of that curve depends on the incremental $\mu$-value for the material at point $B_{02}/H_{02}$. In other words, once normal load conditions are restored, the magnetic state of the magnet 3 will shift along lince $C^1$, and if the previously assumed minimum flux extracting-minimum load conduction conditions are present, the magnet will settle to an operating point that is the intersection of line $C^1$ with line *a*.

The phenomenon described above, i.e. the dropping of the flux (demagnetization) of the magnet below the demagnetization curve-minimum impedance line intersection, is a serious problem for all magnetic systems with permanent magnets. Particularly, if a demagnetizing energization is provided that is larger than all previously applied magnetic energizations causing such a reduction in the magnetic flux so that the operating point is shifted down, and now the working parameters of the system are changed. In other words, if the system was designed to operate with a working point at or near point $B_{O1}/H_{O1}$, a strong temporary demagnetization may lead to a working point that is the intersections of lines $C^1$ and *a*. Now, the responses in the magnetic system do not longer agree with those for which the system was designed to begin with, if, in face $B_{O1}/H_{O1}$ was that chosen working point. Quite possibly, the system is now rendered useless.

As stated above, the operating point of the magnet 3 is the intersection of its particular demagnetization curve with the load dependent shear line. Operating point $B_{O1}$; $H_{O1}$ in particular, is the intersection of the particular demagnetization curve $E_1$ with the minimum permeance, load shear line *a*, the latter being determined primarily by the shunt 4,5. Therefore, point $B_{O1}$; $H_{O1}$ will be reached even if the magnet 3 is magnetized under a load exclusively established by these shunt elements. Depending on other conditions, such as armature presence, position, etc., other elements in the magnetic load circuit of magnet 3 add finite magnetic load-conduction values. These additional elements modify the load on the magnet, and the resultant load is represented by line *b* whose slope will vary with variations in the total magnetic permeance in the magnetic system and circuit. However, these variations will be effective only to a very small extent, the more the shunts establish the dominating permeance and load. Thus, differing energization of the relay and variations in the air gap between armature and yoke will change line *b* to a minor extent, if, in fact, the shunt load dominates. Please note here the dual aspect of the shunts: together with the magnet itself they have the largest magnetic permeance in the magnet circuit of the system; additional permeances are added to the circuit in parallel, so that magnet and shunt alone establish the smallest overall permeance that is effective in the system during operation and smaller overall permeance leading to smaller flux extractions and larger demagnetization magnetomotive forces will not occur.

Nevertheless the true operating point is now the intersection of line *b* with the $\mu$-line C (not with the demagnetization curve $E_1$). The operating point is on the curve $E_1$ only when the effective shear line is, in fact, *a*. This may be the case if the magnet is overexcited so that zero force acts on the armature in an abutment position. Such an operating state will normally not occur. If one would energize the relay coil 8 still further excessively, then the operating point would drop further along curve $E_1$, because line C does not have a continuation brance to the left of the $E_1/a$ intersection (i.e. point $B_{O1}$; $H_{O1}$). Following the excessive energization, a new working point would be extablished and a new C-line being parallel to the illustrated one but shifted down. This may be, for example, the line $C^1$. Thus, we describe presently the demagnetization on account of load changes on the basis of the externally applied relay coil energization which, as stated, can lead to a working point change that is so dangerous to polarized relays. That new working point will be, now on a more refined basis, the intersection of line $C^1$ with load line *b* as the latter represents actual load conditions more accurately.

During normal operation, the effective magnetic load impedance curve *b* has always a larger slope than curve *a*. Its slope is calculated from the sum of the magnetic permeance of the shunt 4,5, and of the other (minor) magnetic conductors of and in the system, including the magnetic substitute permeance of the energization. Since, as stated, the shunt constitutes the dominating magnetic conductor, the effective curve *b* differs very little from curve *a*. Consequently, the working point will vary along line C only to a very small extent.

Figure 2:
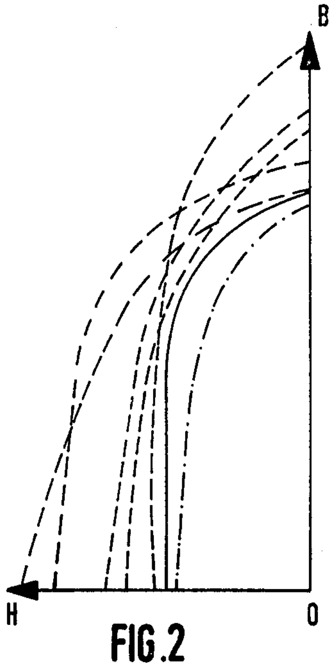
FIG. 2 is a plot of several demagnetization curves of a material chosen for the magnet in the system of FIG. 1.

After having explained relationships as they have validity for a particular magnet in a particular (load) system, I turn to FIG. 2 showing a great variety of demagnetization curves (in dashed lines) as they more or less unpredictably occure even for magnets made of similar material, from the same batch, and having similar dimensions. The scatter may not always be as bad as plotted, but the variations are frequently of significant magnitude indeed. Thus, if a magnet is subjected to a particular magnetization process, one cannot accurately predict an operating point. Particularly for relays this is quite undesirable as armature response times, holding forces, etc., will all be different. Added to that is a dynamic change in the operating point during operation which is pronounced if the shunt is small or missing entirely.

After having explained the relevant particulars of a permanent magnet in a magnetic circuit and the problems related thereto, we proceed to particulars of the inventive magnetization method which avoids these problems. In accordance with the principle feature of the present invention, the effect of the variations of the demagnetization curves, is eliminated by a procedure which will always produce the same working or operating point for the magnet and its load system.

FIG. 2 illustrates also a curve (shown as solid line), which is the limit curve or envelope of all demagnetization curves as they may occur with this particular material. This limit curve can be used as (hypothetical) worst case kind of demagnetization curve for controlling the magnetization process. This curve is empirically produced. As an alternative, one can use a still-worse-curve, drawn in a dash-dot line in FIG. 2, and being below and to the right of the aforesaid limit curve. This way, one adds a margin of safety if the empirically found limit curve is not really the limit curve but was not quite correct in that respect because not enough samples were taken. Selection of either curve is based on the point that one must be certain that any actual demagnetization curve has always larger B/H values, i.c. is situated in the range of larger B/H values as compared with the chosen, hypothetical, demagnetization curve.

Figure 3:
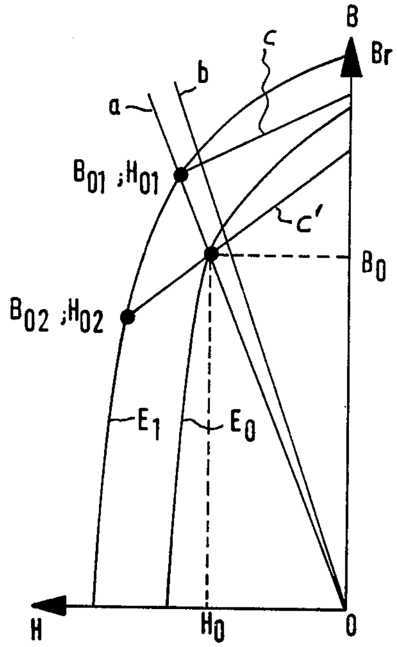
FIG. 3 is a magnetization diagram used for explaining the inventive method.

Such hypothetical curve is shown also as curve $E_O$ in FIG. 3; it may be a limit curve or a still lower curve as per the dash-dot example of FIG. 2. The calculation of the magnet system is then based on a (hypothetical as first) operating point $B_O/H_O$ which is the point of intersection of line *a* with hypothetical demagnetization curve $E_O$, whereby this line takes into consideration, e.g. the perspective particular shunt, possibly even other constant permeances to establish an operating point under particular minimum flux extraction conditions. In other words, upon designing the magnetic system as a whole, the various relevant parameters of, e.g. a relay, are based on an assumed working poing or operating point $B_0/H_0$.

Thus, it will be appreciated that actually occuring B/H values of any true demagnetization curve will not fall below the curve $E_0$, and all occurring demagnetization curves of the particular material will be situated to the left of curve $E_0$. The chosen point $B_0/H_0$ will, however, be located on a shear and load impedance line *a*. Curve $E_1$ is but one example here, but the curve $E_1$ per se was unpredictable otherwise.

After magnet 3 was magnetized by an external magnetizing field, the working point would be $B_{01}/H_{01}$ if the load were exclusively represented by the shunt elements 4, 5. However, the other magnetic elements in the system such as the yokes 1 and 2, and the armature 7, add magnetic load so that the load impedance curve is as per line *b*. Consequently, the actual working point reached following magnetization, is the intersection of lines *b* and *c* which was, in fact, unpredicted and does not correspond to the point $B_0/H_0$ selected to serve as operating point for the relay and the magnet system.

In accordance with the present invention, the magnet 3 is now demagnetized intentionally so that the magnetic induction in the magnet is lowered to reach point $B_0/H_0$. In accordance with the inventive method, this demagnetization is obtained, for example, by means of an external magnetic demagnetizing field, conceivably through current pulses applied to coil 8. Alternatively, one could change the air gap foil 6 as to its thickness or even through mechanical vibrations, or one could apply thermal energy to reduce the magnetic induction in the magnet. In either case, one must obtain a reduction in effective magnetic induction until one reaches the point $B_0/H_0$. Since one will process different magnets in like manner but to a different degree of controlled demagnetization, uniform specifications for several or even many magnetic systems can be obtained on the basis of that point $B_0/H_0$.

The method is preferably practiced by stepwise approaching point $B_0/H_0$, beginning from the particular point $B_{01}/H_{01}$. Intentional demagnetization will lead to different points on the demagnetization curve $E_1$, but $B_0/H_0$ is not located on that curve. It is for this reason that the $\mu$-lines such as *c* and the load lines such as *a* and *b* were introduced above. It was mentioned that the point $B_0/H_0$ must be located on a load line, e.g. line *a*. Now, the additional statement is in order that the point $B_0/H_0$ is also traversed by a particular $\mu$-line, namely the specific line $C^1$. That line, in turn, originates in a point such as $B_{02}/H_{02}$ on demagnetization curve $E_1$, so that active demagnetization will actually lead to point $B_{02}/H_{02}$, as its $\mu$-line $C^1$ intersects with line *a* at the desired operating point $B_0/H_0$.

A stepwise demagnetization is desirable because one needs to test in between how far the point $H_0/B_0$ has been approached to make sure that one will not under or over shoot. Testing may involve measuring the magnetic induction, i.e. the flux or the magnetic induction, the flux density or the magnetic field strength, i.e. the magnetic potential or magnetomotive force effective at the magnet under specific load conditions. These load conditions may be those for the minimum permeance of the system, so that the stepwise demagnetization leads the magnet along line *a* until point $H_0/B_0$ has been reached.

Broadly speaking, therefor, one selects at first a hypothetical working point (e.g. $H_0/B_0$) which is positively not located on any demagnetization curve as they may occur for the particular type of magnet. A load-permeance line can, however, be drawn through that selected point and conceivably the point has been selected to represent smallest possible flux density as it may occur on the magnet during operation so that the load and permeance line is selected accordingly. Line *a* may be such a line. The magnetic material 3 is then magnetized and the specific load conditions are established so that the magnet settles on unpredicted point $B_{01}/H_{01}$. Now, the magnet is load-relieved i.e. actively demagnetized so that its magnetic state runs down somewhat on curve $E_1$. Upon restoring the load conditions as per the selected load and permeance line *a*, the magnetic state of the magnet-load system will settle on another part on line *a* given by the intersection of line *a* with a straight $\mu$ line which (i) originates at the point reached by demagnetization on the curve $E_1$and (ii) slopes upwardly as per the effective permeability $\mu$. That intersection point is determined (e.g. through measurement of the effective B- value), compared with $B_0$ and another demagnetization step may be necessary, etc. Thus, the operating point is progressively shifted on line a towards $H_0/B_0$. That point will be reached when active demagnetization has reached a point on the demagnetization curve in which originates a $\mu$ line (namely $C^I$) on which is located $B_0/H_0$. That point on $E_1$ is, of course, $B_{02}/H_{02}$.

The procedure above assumes that following demagnetization the specific load conditions as per line *a* are established to permit direct tracking. Thus, e.g. induction B is measured on the magnet plus shunt subsystem as that subsystem establishes minimum permeance represented by the line *a*. The situation is different if the load conditions during the process (at least during tracking) are such as they will be maintained later. For example, if the magnet is installed in the relay, line *b* is effective but may even be a variable one. Now, however, one may use a different kind of test which is a more indirect one. One tests the magnetic holding force by means of which armature 7 is held against yokes 1 and 2. This force has to have a particular value commensurate with the operating point $B_0/H_0$, and for a corresponding predetermined excitation. For example, one can measure whether or not this holding force drops to zero for a particular excessive excitation of coil 8 determined on this basis of the operating point $B_0/H_0$.

Such excessive excitation compensates the influence of the residual magnetic impedances, other than the shunts, so that the latter determine exclusively the load for the permanent magnet. Particularly, holding force zero occurs when the excitation through coil 8 compensates the effective flux at the armature as biased through the magnet. Thus, holding force zero of the armature in an abuting position is the equivalent of a load condition on the magnet. Corresponding to load line *a* minimum permeance, which now, however, is dynamically obtained. As the holding force of the armature is reduced to zero, the magnet "sees" only the shunt; no permanent magnet flux runs through yokes and armature. This operating state and condition is now used as follows.

Following the initial magnetization and upon establishing true load conditions, the magnet settles on a point given by the *a-c* intersection. Upon energizing coil 8 to reduce the armature holding force to zero, the operating point is shifted to point $B_{01}/H_0$. Either, the induction or the magnetomotive force on the magnet can now be measured as before, or one can measure the particular energization of coil 8 needed to obtain holding force zero as that is likewise an indicaion whether or not the true and desired operating point has been reached. This is so as a particular energization to obtain holding force zero is associated with $H_0/B_0$ only for the given load conditions as established by lines *a* and *b*. Following a demagnetization step and load restoration the magnet settles on a point on line b, and the energization needed to obtain zero holding force will have a particular value only when, in fact, that point was the interseciton of $C^1$ and b, as only then will the energization needed to obtaining zero holding force be the particular holding force, shifting the then effective point on line $C^1$ to point $H_0/B_0$. Actual holding force as provided in each instance and particular holding force can be represented by suitable signals to be compared with each other so as to obtain an indication how close one has progressed towards the desired operating point. Thus, the energization producing a holding force zero is measured periodically and compared with the calculated value for such excitation as per (still hypothetical) point $B_0/H_0$. The conceivable deviation between the two energizations is an indication as to how much the induction must be lowered by active demagnetization so that the point $B_{02}/H_{02}$ be reached. As stated, the latter point may be reached by stepwise approximation, i.e. by stepwise application of demagnetization interspersed with measurements of the energization needed to arrive at zero attraction force.

The deviation in energizations (actual vs needed) for producing zero armature attraction force, or the deviation between $B_0$and actual induction or/between $H_0$and actual magnetomotive force, is measured after each active demagnetization step and can be used quantitatively to control the magnitude of the next demagnetization step so that point $B_{02}/H_{02}$ be reached with but a few steps.

Still other kinds of measurements can be made to determine indirectly intial deviation from and subsequently to proper approach to the desired working point $H_0/B_0$. One can measure the particle response excitation needed for setting the armature into motion or the speed of response of the armature. This method has the advantage that the measurement includes deviations, e.g. in the construction of the contact springs or other mechanical parts from normal. The working point approached here may not be exactly $B_0/H_0$, but the deviation compensates, e.g. defects or just tolerances, in the contact system so that the relay will still work properly. In other words, one introduces here intentionally an inherently different working point whereby this difference automatically includes exactly an offset as it is needed to compensate mechanical system tolerances or even defects. The stepwise demagnetization does not approach a particular $H_0/B_0$ value pair in that case, but a working point that produces a particular response of the armature. Strictly speaking, point $B_0/H_0$ is obtainable only for armature force zero in the abutment position at the corresponding excitation of the relay coil. All other operating states (smaller energization) correspond to operating points to the right of $B_0/H_0$ on the $\mu$-line $C_1$.

It should be noted that the inventive method can be used to obtain other operating points, not just the particular one called $H_0/B_0$. Since the properties of the material vary as stated, one must expect also a difference in permeability from magnet to magnet so that actually just one point can be accurately predetermined. Other points (e.g. different load conditions) will not necessarly agree with the critical prediction. However, the $\mu$-values vary only very little, and upon appropriate dimensioning the shunt load, all actually occurring other operating points on the $\mu$-line are very closely spaced anyway, so that slope variations in the C-lines due to variations in $\mu$ introduce only higher order errors of negligible consequences.

As stated above, the actually occurring working points are not located on a demagnetization curve but on a $\mu$-line (C, $C^1$) originating in a point on the true (but unknown) demagnetization curve. This way, one obtains actually greater stability. Assuming, for example, that the demagnetization curve of a very poor magnetic material does run close to or even through $H_0/B_0$, a very significant excessive excitation is needed to produce zero armature attraction force in the abutting position of armature and yokes and the working point will be actually shifted only for still larger excitation or other magnetizing forces. On the other hand, better magnets with demagnetization characteristics well to the left and above of $H_0/B_0$ permit occurrence of still larger demagnetization forces before such forces can shift the currently effective operating point a little to the left of $B_0/H_0$ and on the $\mu$-line, and still not down the actual demagnetization curve! After these forces have decayed, the original working point is immediately restored. A true and permanent shift occurs only when demagnetization is so strong that $B_{02}/H_{02}$ is exceeded, and only then will a lasting demagnetization shift occur actually on the curve $E_1$, in down direction. That, in turn, would produce a parallel down-shift of the subsequently effective $\mu$-line, which results in a permanent change in the operating conditions.

In reality then, the stability of the established working conditions for the permanent magnet in the system results from the fact that the actively produced operating point $H_0/B_0$ is sufficiently far from any expected true demagnetization force so that load and condition changes in the system will not or hardly cause the magnetic state of the magnet to return to its true demagnetization curve; only then would occur a permanent change in working point. On the other hand, it can readily be seen that, broadly speaking, a magnetizing effect on the system that would shift the working point from $B_0/H_0$ to $B_{02}/H_{02}$ is the maximum permissible external influence corresponding to, e.g. the maximum permissible excessive excitation on the relay coil. This maximum permissible excessive energization should be noted as a limit condition and the user of the system may be advised, e.g. to provide for current limiting circuitry in the relay circuit.

It should also be noted that safety against excessive energization is the better the larger, i.e. the stronger is the magnetic shunt. The reason is that these shunts bypass most of the demagnetizing fields in the system during operation so that only little affects the permanent magnet. And even that small portion would endanger the magnet only after the demagnetization has reached $B_{02}/H_{02}$ on the $\mu$-line $C^1$.

A strong magnetic shunt is represented by a steep line *a*. Thus, considerable energization is needed to exceed the point $B_0/H_0$ on the $\mu$-line. Also, the various working points corresponding to the different but normal operating conditions are necessarily located very close to each other on the $\mu$-line $C^1$, the higher the relative permeance of magnet and shunt are in proportion to the magnetic permeance of the rest of the magnetic circuit. Moreover, any different $\mu$-values (slope of line $C^1$) will have no practical effect, simply because one uses only a very small portion of the $\mu$-line. Thus, the potential (field strength-$H_0$) of the magnet can be regarded as constant. To state it differently, the different lines *b* differ from each other and from line *a* very little; the angle between them is very small because the equivalent permeance of the entire system varies very little, always assuming that the shunts are the dominating loads, so that point $H_0/B_0$ is maintained very stable.

Figure 4:
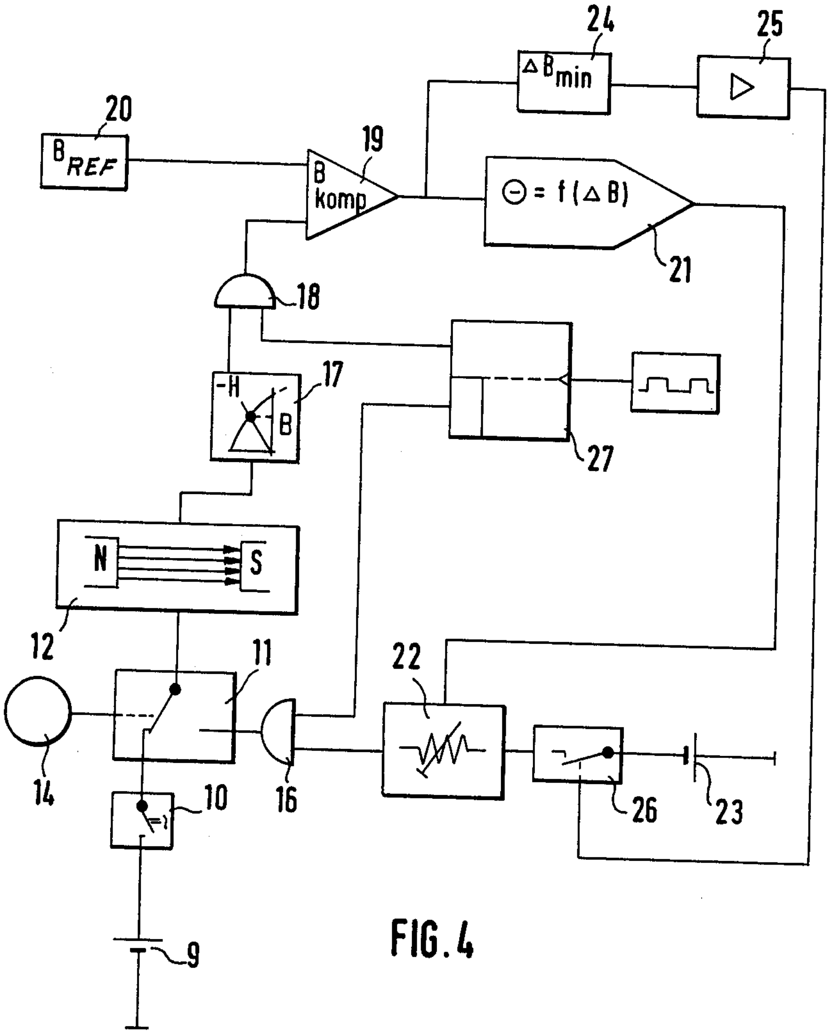
FIG. 4 is a block diagram of a device for practicing the inventive method.

FIG. 4 illustrates a system for practicing the inventive method. The system operates in a closed loop and provides for initial magnetization followed by stepwise demagnetization interspersed with measuring steps. The equipment includes a first source 9 for d.c. potential to be connected via a switch 10 and a switch 11 to the coil of an electromagnet 12. This magnet is rather strong and provides a strong magnetic field between its pole shoes. These pole shoes are sufficiently spaced-apart from each other so that an element 3 to be made into permanent magnet, preferably mounted in the shunt elements, possibly even the entire relay can be placed in between. Thus, upon closing switch 10, and for the illustrated position of switch 11, the magnet 3 is magnetized to saturation. A timer 14 responds to the initial closing of switch 10 and maintain switch 11 in the illustrated position for a period sufficient to really magnetize magnet 3 well into saturation. After timer 14 has run, switch 11 changes position and closes a loop to be described next.

Reference numeral 27 refers to a toggle flip-flop which is triggered by a source of clock pulses and changes state at the clock pulse rate. In one state of the flip-flop it opens and "and" gate 16 (or its equivalent)

and in the opposite state, flip-flop 27 closes gate 16 while an "and" gate 18 is open.

When gate 16 is open, a voltage source 23 is connected to electromagnet 12 via an adjustable resistor 22; device 26 may be a controlled impedance, e.g. a suitably controlled semiconductor device, a gain controlled amplifier or the like. Gate 16 feeds its output directly through switch 11 to the coil of magnet 12. It must be assumed, moreover, that a switch 26 is closed. The source 23 is now connected to electromagnet 12 at such a plurality that it tends to demagnetize the magnet 3. The intensity of the demagnetization is determined by the adjustment of resistor, impedance or network 22. The clock pulse source may actually provide pulses at similar or alternatingly different spacing, whereby the shorter period between two pulses is particularly adapted to permit metering current pulses which become effective for demagnetization. Independently therefrom is the period needed for measuring the result of the demagnetization which, in turn, controls the adjustment for the next demagnetization step as follows.

A measuring instrument 17 is connected to the magnet 3 in device 12 and measures the induction or field strength of and at the permanent magent. The measurement is, of course, meaningless per se during magnetization and demagnetization, but upon occurrence of the next clock pulse following a demagnetization pulse, gate 16 is blocked, and demagnetization ceases. Now gate 18 is open and the measuring result is derived from device 17 and applied to one input of a comparator 19. The other input of the comparator 19 receives a reference value from a source 20. This reference value corresponds to the induction $B_0$ (or to the field strength $H_0$). It should be noted that measurement on one hand, and reference value on the other hand, must also take into consideration under what conditions the measurements are made. If the point $H_0/B_0$ to be approached by this process, is actually located on the line *a* for minimum flux extraction, then the magnet 3 must be measured under such load conditions.

The comparator 19 determines the difference in actual induction and in the desired induction as represented by the reference signal from 20. If there is a difference (which can have only a positive sign), this difference is modified by a non-linear amplifier which can also be regarded as a function generator 21 to process the difference or differential signal so that a control signal results being suitable for modifying the resistance 22. Generally speaking, the control is such that network, device, etc., 22 is adjusted to permit a large current flow for large differences as detected by comparator 19, and 22 throttles current flow to smaller values for small comparator differences.

The primary purpose of function generator 21 is to generate a signal for the network 22 so that a large signal differential as detected by the comparator 19 will lead close to but not onto or even below the desired working point $B_0/H_0$.

It can thus be seen that following the detection of a large difference between actual and desired induction of magnet 3, network 22 is adjusted for a large current flow, and with the next clock pulse a strong current pulse is passed to electromagnet 13 which, in turn, causes rather strong demagnetization in magnet 3. The next clock pulse terminates this demagnetization step and comparator 19 forms a new difference which, presumably, is smaller than the previous one. Thus, the next demagnetization signal produced via 22 as newly adjusted, is smaller. This way one obtains a stepwise approach of the actual magnetization towards the desired one. The stepwise demagnetization process runs down along the demagnetizing curve from $B_{O1}/H_{01}$, but as far as measurement is concerned that approximation is monitored along the line *a*! The output of comparator 19 is also applied to a threshold detector 24 being, e.g. a Schmitt trigger whose output is fed to an amplifier 25. As long as the detected difference is above the adjusted threshold, amplifier 25 keeps switch 26 closed. As soon as the difference drops below the detected threshold, switch 26 is opened and the demagnetization is terminated; the magnetic state of magnet 3 is now deemed sufficiently close to the desired working point.

It should be noted that each of the demagnetization steps, including the first one, is smaller than the initial magnetization. Moreover, the network 22 is dimensioned that none of the steps including the first one can cause demagnetization that would lead to an induction smaller than the desired value. Thus, following the initial magnetization, magnet 3 is stepwise demagnetized, whereby the demagnetization steps become smaller and smaller until the desired value has been sufficiently closely approximated. Each step is followed by a measuring step which in the present example is assumed to be a step measuring directly the induction of the permanent magnet.

Other measuring methods can be used as outlined above and in each instance, one precalculates a desired reference value which then indirectly represents an operating condition for the relay corresponding to an induction B.

The invention is not limited to the active magnetization-demagnetization of magnets in a relay, but is applicable to other systems employing permanent magnets as well. Also, use of a shunt is very desirable for the stated advantages, but presence of a shunt is not mandatory for practicing the invention. The shape of the magnetically conductive parts may well differ from those shown in FIG. 1, including, for example, annular yokes. Also, multiple permanent magnets in single systems may be magnetized and/or demagnetized in unison.

The invention is not limited to the embodiments described above but all changes and modifications thereof not constituting departures from the spirit and scope of the invention are intended to be included.

I claim:

1. Method of providing a permanent magnet with a particular magnetization, comprising the steps of:

providing a particular load condition for the magnet, which includes a parallel shunt for the magnet, the magnetic permeance of the magnet and of the shunt together exceeding the sum of a magnetic permeance of any additional load or load relief on the magnet during subsequent use;

selecting a particular operation point in a hypothetical magnetic flux/field diagram which is inside of all actual demagnetization curves for magnetizable material from which the magnet is made, said operating point being determined based upon said particular load condition of the magnet, and providing a signal representation thereof;

magnetizing the magnet to establish a permanent magnetic state, the magnet obtaining therewith a particular demagnetization curve which does not include said point;

stepwise reducing the resulting permanent magnetization by particular demagnetization steps;

measuring a parameter indicative of the permanent magnetization in between the steps of the stepwise reducing and comparing this parameter with the signal representation to determine whether the particular operating point is approached said measuring being along a load characteristics for the magnet corresponding to magnetic flux extraction not larger than during normal load conditions during subsequent use of the magnet; and terminating the stepwise reducing when the said point has been reached at least approximately.

2. Method as in claim 1, wherein the demagnetization steps are provided by application of external demagnetizing fields.

3. Method as in claim 1, wherein a minimum flux extraction condition is established by said shunt.

4. Method as in claim 1, and including additionally measuring an external energization needed to cause the effective operating point of the magnet to shift from the particular operating point, once established, to a point on the actual demagnetization curve of the magnet.

5. Method of providing a piece of permanently magnetizable material with a permanent magnetization of particular value, comprising the steps of:

determining the load conditions of the magnet in a particular magnetic system;

selecting a particular operating point in a hypothetical magnetic flux/field diagram which is inside of all actual demagnetization curves for magnetizable material from which the magnet is made, said point being determined based upon said load conditions;

providing a particular reference value indicative of said particular operating point for the permanent magnet to be made and under load conditions of use in a particular magnetic system;

magnetizing said piece of material to obtain a permanent magnetization in said piece following termination of the magetizing thereby providing said magnet;

stepwise reducing the magnetization in said magnet;

measuring a particular operating value of or in relation to said magnet under conditions of particular magnetic flux extraction and load conditions for the magnet, following each said reducing steps;

comparing said reference value with said operating value in each instance; and continuing or discontinuing said stepwise reducing depending on whether or not the respective measured values agree at least approximately with said reference value.

6. Method as in claim 5, wherein each comparing step is used to control the strength of the respective next reducing step.

7. Method as in claim 5, and as practiced in a magnetic system of which the piece is a part and wherein the reference value is indicative of a magnetic attraction and holding force of the magnet in the system at said operating point, said particular operating value representing the actual holding force

8. Method as in claim 7, wherein the reference value is a particular value for an energization in the system to compensate the holding force, at said operating point said operating value being the actual energization needed to compensate said holding force.

9. Method as in claim 7, wherein the system being an electromagnetic relay with an arnmature and a yoke, the holding force being the force of holding the armature against the yoke.

10. Method as in claim 5, and as practiced in a magnetic system of which the piece is a part and wherein the particular operating value is the response period for a movable part in the system.

11. Method as in claim 5, and as practiced in a magnetic system of which the piece is a part and wherein the particular operating value is an external energization in the system to produce therein a particular response.

12. Method as in claim 11, wherein the particular response is the energization needed to move a movable element in the system.

13. Method as in claim 5, and as practiced in a magnetic system of which the piece is a part and wherein the particular operating value is the magnetic field strength, of the magnet under particular load conditions in the system, the reference value representing the magnetic field strength at said operating point.

14. Method as in claim 5, wherein the particular operating value is the magnetic induction, i.e. flux, of the magnet under particular load conditions.

15. Method as in claim 5, wherein the continuing-discontinuing step includes detecting a signal differential as between measured and reference values, and detecting whether the differential exceeds a particular value, if not said stepwise reducing is discontinued.

16. Method as in claim 5, wherein said magnetizing step is automatically terminated on the basis of detecting a particular duration of magnetization.

17. Method as in claim 5, and including the step of operating the stepwise reducing and measuring steps in a predetermined clocking rate.

18. Method as in claim 5, wherein said stepwise reducing step is carried out in steps of progressively reduced magnitude.

19. Method of permanently magnetizing an element to serve as a permanent magnet in a magnetic system, comprising the steps of:

providing each element with a magnetic shunt so that the magnetic permeance of the shunt and of the element is larger than the sum of the permeances of the remaining parts of the system;

magnetizing the element in the system;

measuring the magnetic state of the permanent magnet in the system; and demagnetizing the magnet to arrive at a particular magnetic state.

20. Method as in claim 19, wherein the particular magnetic state is identified by a particular induction under load conditions establishing an operating point not on, but inside of the demagnetization curve of the magnet.

21. Method as in claim 19, wherein the particular magnetic state is identified by a particular operating state of the system, the resulting operating point of the magnet is not on, but inside of the demagnetization curve of the magnet.

22. Method as in claim 19, wherein the demagnetization step is carried in plural steps of progressively reduced magnitude.

23. Method of providing a plurality of permanent magnets respectively resulting from magnetizing a magnetizable element and provided for serving as magnetic bias elements in magnetic systems under similar conditions in each instance, comprising the steps of:

providing for each of said elements particular magnetic load conditions comparable with or actually including at least parts of the load as provided by each of said systems for the respective element when serving therein respectively as permanent magnet;

selecting a particular operating point in a hypothetical magnetic flux/field diagram which is inside of all actual demagnetization curves for magnetizable materials from which the magnets are to be made, said operating point being determined based upon said particular magnetic load condition for each of said elements;

magnetizing each of said elements and following said magnetization, each said elements having a particular demagnetization curve, the demagnetization curves differing in the several elements; and particularly demagnetizing each of said elements to establish for each of said elements a magnetic state corresponding to said selected operating point for all elements in the respective system and under the said particular load conditions in each instance.

* * * * *

UNITED STATES PATENT AND TRADEMARK OFFICE

CERTIFICATE OF CORRECTION

PATENT NO. : 4,104,591

DATED : August 1, 1978

INVENTOR(S) : HANS-WERNER REUTING

It is certified that error appears in the above-identified patent and that said Letters Patent are hereby corrected as shown below:

[19] REUTING

[75] HANS-WERNER REUTING, Peine, Fed.Rep.of Germany

Signed and Sealed this

*Thirteenth* Day of *March 1979*

[SEAL]

*Attest:*

RUTH C. MASON
*Attesting Officer*

DONALD W. BANNER
*Commissioner of Patents and Trademarks*